United States Patent [19]

Boudrant et al.

[11] Patent Number: 5,206,793
[45] Date of Patent: Apr. 27, 1993

[54] DIODE WITH ELECTRODES AND CASE ASSEMBLED WITHOUT SOLDERING OR CRIMPING, AND RECTIFIER BRIDGE MADE WITH SUCH DIODES

[75] Inventors: Antoine Boudrant, Paris; Bela Skorucak, Cormeilles en Parisis, France

[73] Assignee: Auxilec, Chatou, France

[21] Appl. No.: 739,850

[22] Filed: Aug. 2, 1991

[30] Foreign Application Priority Data

Aug. 7, 1990 [FR] France .................. 90 10067

[51] Int. Cl.⁵ .................................. H05K 7/20
[52] U.S. Cl. ............................ 257/689; 361/388; 361/386; 257/699; 257/719
[58] Field of Search ............... 165/80.3, 185; 174/16.3; 357/79, 81; 361/386, 383, 388–389

[56] References Cited

U.S. PATENT DOCUMENTS

| | | | |
|---|---|---|---|
| 3,662,231 | 5/1972 | Goodacre | 357/79 |
| 4,224,663 | 9/1980 | Maiese et al. | 363/388 |
| 4,305,087 | 12/1981 | Wislocky | 357/79 |
| 4,670,678 | 6/1987 | Jäger et al. | 310/68 D |

FOREIGN PATENT DOCUMENTS

| | | |
|---|---|---|
| 0022359 | 1/1981 | European Pat. Off. . |
| 1614630 | 5/1970 | Fed. Rep. of Germany . |
| 3524191 | 1/1986 | Fed. Rep. of Germany . |
| 2077332 | 10/1971 | France . |
| 2157487 | 10/1985 | United Kingdom . |

Primary Examiner—Gregory D. Thompson
Attorney, Agent, or Firm—Oblon, Spivak, McClelland, Maier & Neustadt

[57] ABSTRACT

A diode assembly having electrodes and a case assembled without soldering or crimping, wherein the electrodes are maintained connected to respective opposite faces of a diode chip by simple intimate contact of electrical and thermal conduction under the permanent action of a pressure exerted by an elastic element. The case is closed by a cover kept solidly in closing position by a simple wedging effect under a continuous thrust exerted by the elastic element.

12 Claims, 1 Drawing Sheet

U.S. Patent  Apr. 27, 1993  5,206,793
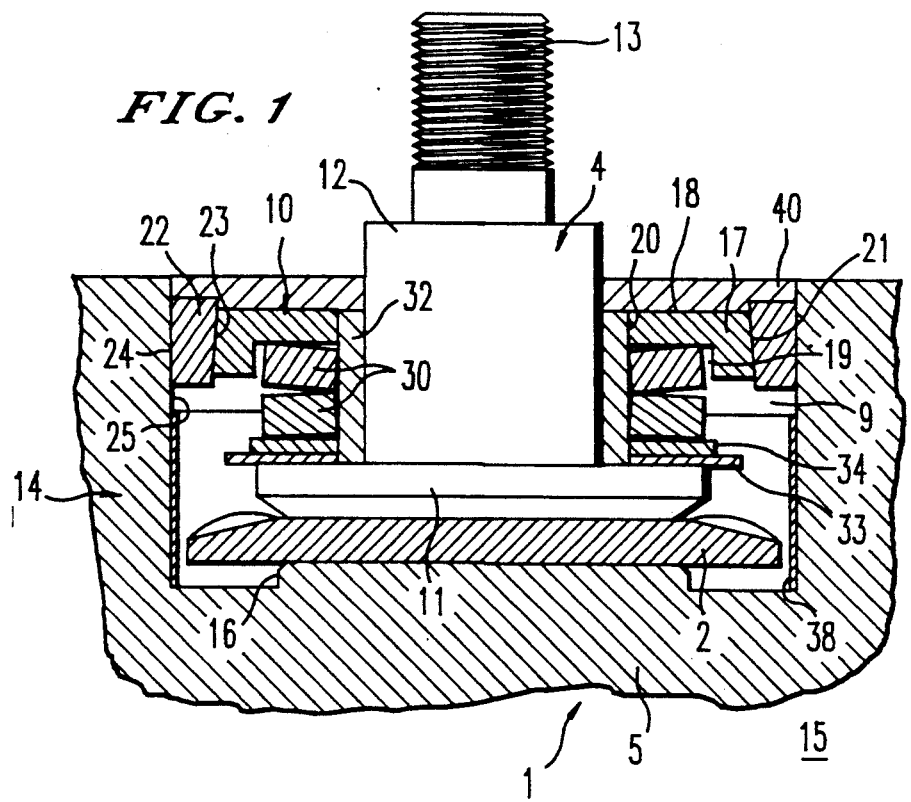
FIG. 1
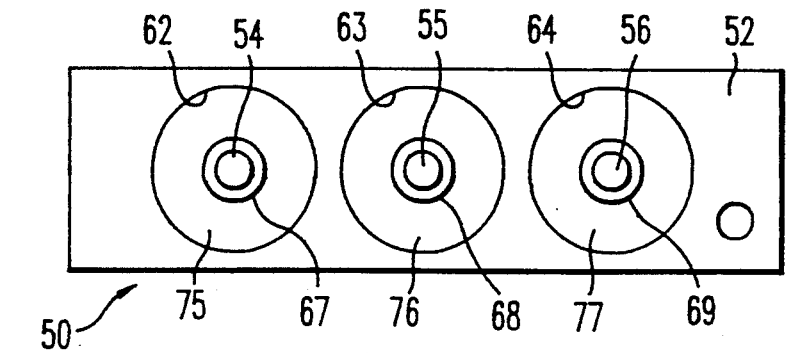
FIG. 2
FIG. 3

DIODE WITH ELECTRODES AND CASE ASSEMBLED WITHOUT SOLDERING OR CRIMPING, AND RECTIFIER BRIDGE MADE WITH SUCH DIODES

BACKGROUND OF THE INVENTION

1. Field of the Invention

This invention relates to a diode with electrodes and case assembled without soldering or crimping and a rectifier bridge made with such diodes.

2. Discussion of the Background

Besides batteries and commutator dc generators, direct current can also be supplied by rectifier alternators or by rectifier transformers from an alternating current source. These rectifier alternators and rectifier transformers comprise one or more rectifier bridges which convert the alternating current at the input into direct or rectified current at the output. A rectifier bridge consists of a certain number of diodes whose operation generates heat losses which require an effective heat dissipation to avoid any harmful elevation of temperature. The known marketed diodes are generally individually enclosed in standard hermetic cases that protect them from all outside attacks of mechanical, chemical or electrical origin. In their use, these known diodes are generally combined with heat sinks of good heat conductive material fastened to their protective cases to increase their surface of heat exchange with the environment or with a convection of cooling fluid and to carry away effectively the heat generated by their heat losses during their operation. To the volumes and weights of the cases of these known diodes are also added the volume and weight of their heat sinks so that a rectifier bridge made with these known diodes is relatively bulky and heavy. Such a rectifier bridge cannot be recommended for certain equipment such as, for example, aircraft equipment where a reduced size and a light weight are generally required.

Moreover, to assure a better reliability of the operation, supercapacity diodes, i.e., diodes that function not at their nominal current but at a value less than this current are often selected to constitute the rectifier bridge. Further, heat sinks corresponding to the nominal power of these diodes are generally combined with the latter. These superpowerful diodes with their combined heat sinks are normally bulkier and heavier than normal capacity diodes equipped with their heat sinks. As a result, rectifier bridges made with these superpowerful diodes are relatively bulky and heavy.

Further, the known diodes are relatively costly, since the assembly of their electrodes and metal or metalloceramic cases, by soldering and crimping, often resort to complex processes and generally expensive tools.

SUMMARY OF THE INVENTION

Accordingly, one object of this invention is to avoid the above drawbacks, and make it possible to produce a diode effective in operation, economical in production, small-sized, light-weight and provided with electrodes and case assembled without soldering or crimping.

Another object of this invention is to provide a rectifier bridge that is economical, effective, light and small-sized made with such diodes.

These and other objects are achieved according to the invention, by providing a novel diode with electrodes and case assembled without soldering or crimping wherein the electrodes are kept assembled on the two opposite faces of a semiconductor diode chip, by simple intimate contact of electrical and thermal conduction under the permanent action of a pressure exerted by an elastic element, and the case is closed by a cover kept securely in position by simple wedging effect under a continuous thrust exerted by this elastic element.

According to the present invention, there is provided a novel rectifier bridge intended to convert polyphase alternating current to a direct or rectified current, including subassemblies with several diodes and each having, for one of the two electrodes of these diodes, a common electrode which also is used as a case and heat sink, and for the other of the two electrodes of these diodes, individual electrodes.

BRIEF DESCRIPTION OF THE DRAWINGS

A more complete appreciation of the invention and many of the attendant advantages thereof will be readily obtained as the same become better understood by reference to the following detailed description when considered in connection with the accompanying drawings, wherein:

FIG. 1 is a partial diagrammatic view in vertical section of a diode made according to the invention;

FIG. 2 is a diagrammatic lateral view in partial section of a variant embodiment in the form of a subassembly with several diodes of FIG. 1; and FIG. 3 represents a partial diagrammatic top view of the subassembly with several diodes of FIG. 2.

DETAILED DESCRIPTION OF THE PREFERRED EMBODIMENTS

Referring now to the drawings, wherein like reference numerals designate identical or corresponding parts throughout the several views, and more particularly to FIG. 1 thereof, a diode 1 there illustrated includes a diode chip 2 with unidirectional passage of electric current of a known type and two input and output electrodes of electric current 4 and 5, respectively assembled on the two opposite faces of this chip 2.

The chip 2 performs the diode function and is placed in a recess 9 formed in electrode that this electrode 5 performs three functions: that of an electrode for an input or an output of electric current, that of a heat sink which carries away the heat generated by heat losses of diode 1 during operation, and that of a case for protecting this chip with unidirectional passage of electric current from any outside attacks of mechanical, chemical or electrical origin.

Recess 9 of electrode 5 is closed by a cover 10. In diode 1, electrodes 4 and 5 and cover 10 of the case are respectively assembled without soldering or crimping.

The two electrodes 4 and 5 are kept assembled on the two opposite faces of chip 2, by simple intimate contact of electrical and thermal conduction under the permanent action of a pressure exerted by an elastic element, while cover 10 is kept securely in closing position in the case recess 9 by simple wedging under a continuous thrust exerted by this elastic element.

In diode 1 of the example of FIG. 1, chip 2 has a circular shape and comprises two opposite faces intended to receive respectively the two electrodes 4 and 5, of which one is an electric current input electrode and the other is an electric current output electrode.

In diode 1, electrode 4 has a shape of a bolt having a flat head 11, a smooth body 12 and a threaded end 13. Flat head 11 is applied in intimate contact of electrical and thermal conduction against a first of two opposite faces of chip 2 and threaded end 13 is intended for fastening of a connecting electric wire or cable. Electrode 5, also acting as case and heat sink of diode 1, has a predetermined geometric shape and comprises a solid part called electrode case 14 and a heat sink part 15 with solid structure or one cut into fins. Electrode case part 14 of electrode 5 comprises a case recess 9 intended to receive chip 2 and electrode 4 whose flat head 11 is applied in intimate contact of electrical and thermal conduction against the first of the two opposite faces of chip 2. The bottom of case recess 9 of electrode 5 is provided with a circular flat projection 16 against which is applied, in intimate contact of electrical and thermal conduction, the second of the two opposite faces of this chip 2.

Cover 10 which closes case recess 9 of electrode 5 comprises two concentric complementary elements able to fit into one another, i.e., on the one hand, a central cup 17 having a solid face 18 oriented toward the outside, a recessed face 19 turned toward the inside of recess 9, an axial opening 20 for the passage of electrode 4 and a tapered or pyramidal peripheral edge 21 whose perimeter gradually increases from solid face 18 to the recessed face 19 and, on the other hand, a slotted concentric outside ring 22 having a tapered or pyramidal hole 2 complementary and fitted to tapered and pyramidal peripheral edge 21 of central cup 17, and a concentric outside edge 24 parallel and fitted to lateral wall 25 of case recess 9 of electrode 5.

In diode 1, chip 2 is strongly pressed against flat projection 16 of the bottom of case recess 9 and flat head 11 of electrode 4 by an elastic element 30 consisting of one or more springs in the form of washers or a coil spring, inserted between central cup 17 of cover 10 of this case recess 9 and the flat head of electrode 4. Electrode 4 is electrically insulated from cover 10 and elastic element 30 by an insulating sheath 32 surrounding its body 12 and by an insulating washer 33 placed between its flat head 11 and a pressure distribution ring 34 of elastic element 30. The edge of chip 2, being spaced from said lateral wall 25 of case recess 9, is electrically insulated by an insulating strip 38 covering this wall in its part below cover 10. Case recess 9 is filled with an inert gas and made hermetic and tight to gaseous and liquid fluids by a synthetic resin layer 40 covering cover 10 and the opening of this case recess 9.

In an assembly of diode 1, insulating strip 38 covering lateral wall 25 of case recess 9 of electrode 5 is put in place and chip 2 is mounted on the bottom of this case recess 9, centered on circular flat projection 16. Electrode 4, with insulating washer 33 and pressure distribution ring 34 placed on the inside face of its head 11 where its body 12 is located, and insulating sheath 32 slipped on its body 12 as well as elastic element 30 and cup 17 mounted around this insulating sheath 32, is applied by the outside face of its flat head 11 against chip 2. A preestablished assembly pressure exerted by a device of a known type, not represented, is applied to cup 17 against elastic element 30 to put cup 17 in a position corresponding to the closing position of cover 10 and at the same time to set this elastic element 30.

Slotted ring 22 is inserted in the space between this cup 17 and lateral wall 25 of case recess 9 until its location corresponding to the closing position of cover 10.

Then, this assembly pressure is eliminated, allowing only set elastic element 30 to act. This elastic element 30, by a first of its two ends, axially thrusts cup 17 to keep cover 10 in closing position by blocking slotted ring 22, and central cup 17 in its location by wedging generated by an interaction of tapered or pyramidal peripheral edge 21 of this central cup 17 and of the wall of the tapered or pyramidal hole of this slotted ring 22, and by a second of its two ends axially thrusts the flat head of electrode 4 and chip 2 against circular flat projection 16 of electrode 5 and, in this way, keeps these electrodes 4 and 5 and chip 2 assembled in intimate contact of electrical and thermal conduction under the permanent action of a pressure.

Case recess 9 thus closed by cover 10 is filled with an inert gas such as nitrogen and made tight to gaseous and liquid fluids by a synthetic resin layer 40 such as an epoxy resin.

According to the invention, diodes 1, thus constructed, make it possible economically to produce rectifier bridges of an alternating current to a direct or rectified current, at the same time effective in operation, reduced in size and light-weight.

A variant embodiment is illustrated in FIGS. 2 and 3 where several diodes are combined into a subassembly 50.

According to the invention, a polyphase rectifier bridge according to a known electric diagram, not represented, is produced with several of these subassemblies 50. An example of a subassembly 50 going into a production of a three-phase rectifier bridge is illustrated in FIGS. 2 and 3. In this three-phase rectifier bridge, the three diodes of each of these subassemblies 50 have either their current input electrodes or their current output electrodes connected together. According to the invention, the subassembly with three diodes 50 (FIGS. 2 and 3) includes a common electrode 52 and three individual electrodes 54, 55, 56.

Individual electrodes 54, 55, 56 have a shape similar to that of electrode 4 of the first example illustrated in FIG. 1, in other words, a shape of a bolt having a flat head 11, a smooth body 12 and a threaded end 13.

Common electrode 52 also used as case and heat sink of subassembly with three diodes 50 includes, as electrode 5 in diode 1 of the first example illustrated in FIG. 1, a solid part called electrode case 60 and a heat sink part 61 having a solid structure not represented or cut into fins (FIG. 2).

In electrode case solid part 60 are formed three case recesses 62, 63, 64 provided in their bottoms with three circular flat projections 67, 68, 69 against which are applied, in intimate contact of electrical and thermal conduction by one of their two opposite faces, a corresponding three chips with unidirectional passage of current such as the one chip 71 as shown in FIG. 2. of their two opposite faces being in in contact of electrical and thermal conduction with the flat head of individual electrodes 54, 55, 56.

Three case recesses 62, 63, 64 are closed by three covers 75, 76, 77 which respectively have a structure similar to that of cover 10, in other words, central cups such as and slotted outside rings such as 82. In three case recesses 62, 63, 64, diode chips 70, 71, 72 are strongly pressed between circular flat projections 67, 68, 69 and the flat heads of individual electrodes 54, 55, 56 by elastic elements such as 86, similar to elastic element 30 of the first example (FIG. 1), each consisting of one or more springs in the form of washers or a coil spring, and inserted between central cups such as 79 of covers such as 76 of covers 75, 76, 77 of these recesses and the flat heads of these individual electrodes 54, 55, 56.

Individual electrodes 54, 55, 56 are electrically insulated from covers 75, 76, 77 and electric elements such as 86, by insulating sheaths and insulating washers similar to insulating sheath 32 and insulating washer 33 of the first example (FIG. 1). Pressure distribution are also placed between elastic elements such as 86, and the insulating washers of the flat heads of electrodes 54, 55, 56, and insulating strips similar to insulating strip 38 of the first example (FIG. 1) also cover the lateral walls of case recesses 62, 63, 64 of common electrode 52 to insulate chips such as 71 with regard to these walls.

Case recesses 62, 63, 64 are filled with an inert gas and made hermetic and tight to gaseous and liquid fluids by a synthetic resin layer such as an epoxy resin covering covers such as 76.

In diode 1 and in subassembly with several diodes 50, the electrodes and cases are thus assembled economically without soldering or crimping. Since electrode 5 of diode 1 and common electrode 52 of subassembly 50 perform at the same time the functions of electrode, case and heat sink, diode 1 and subassembly with several diodes 50 have reduced size and weight which enables them to be part of light, compact equipment, for example, aircraft equipment.

The electrodes are made of metal such as aluminum, bronze, etc.

Obviously, numerous modifications and variations of the present invention are possible in light of the above teachings. It is therefore to be understood that within the scope of the appended claims, the invention may be practiced otherwise than as specifically described herein.

What is claimed as new and desired to be secured by Letters Patent of United States is:

1. A diode assembly comprising at least one diode subassembly which includes:
    a diode chip having opposed faces,
    a first electrode and a second electrode in intimate electrical and thermal contact with a respective one of said opposed faces of said chip,
    a case in which said diode is mounted,
    a cover which closes said case, and
    an elastic element disposed in said case and which applies a permanent pressure action to maintain, on the one hand, said electrodes in intimate contact with said chip and on the other hand, the cover in a closed position.

2. Diode assembly according to claim 1, wherein one of the two electrodes performs three functions at the same time: that of an electrode for an electric current input or output, that of a heat sink which carries away the heat generated by heat losses of said chip in operation, and that of said case for protection of said chip from all outside attacks of mechanical, chemical and electrical origin.

3. Diode assembly according to claim 1, wherein:
    said first electrode is integrally constituted with said case serving as a heat-sink, said first electrode having predetermined geometric shape comprising a solid structure made of two parts, an electrode-case part and a heat-sink part,
    said second electrode has a shape of a bolt comprising a flat head, a smooth body and a threaded end.

4. Diode assembly according to claim 3, wherein said heat-sink part is a solid structure cut into cooling fins.

5. Diode assembly according to claim 2, wherein:
    said first electrode is integrally constituted with said case serving as said heat-sink, said first electrode having predetermined geometric shape comprising a solid structure made of two parts, an electrode-case part and a heat-sink part,
    said second electrode has a shape of a bolt comprising a flat head, a smooth both and a threaded end.

6. Diode assembly according to claim 5, wherein said heat-sink part is a solid structure cut into cooling fins.

7. Diode assembly according to claim 3, wherein said electrode-case part comprises at least one case recess which receives said chip and wherein said heat-sink part comprises a circular flat projection against which is applied, in intimate contact of electrical and thermal conduction, one of the two said opposed faces of said chip, the other face of said chip being applied against the flat head of said second electrode.

8. Diode assembly according to claim 7, wherein said case recess of said first electrode is closed by said cover, said cover comprising:
    two concentric complementary elements that can fit into one another, including, on the one hand, a central cup having a solid face oriented toward the outside, a recessed face turned toward the inside of said recess, an axial opening for the passage of the said second electrode, and a tapered of pyramidal peripheral edge whose perimeter gradually increases from a solid face to said recessed face, and, on the other hand,
    a slotted concentric outside ring having a tapered or pyramidal hole complementary and fitted to the tapered or pyramidal peripheral edge of said central cup and a concentric outside edge, parallel and fitted toa lateral wall of said case recess.

9. Diode assembly according to claim 8 wherein, in said case recess, said elastic element is mounted around the body of said second electrode, which axially thrusts, by one of its ends, the central cup of cover thus to block at the same time the slotted outside ring and said central cup in their location by wedging, and by the other of its ends, the flat head of the second electrode and the chip against the circular flat projection of the first electrode to keep said electrodes and said chip assembled in intimate contact of electrical and thermal conduction.

10. Diode assembly according to claim 9, comprising:
    an insulating sheath mounted in said case recess of said first electrode, said insulating sheath mounted around said second electrode to insulate said cover and said elastic element,
    an insulating washer placed between said flat head of said second electrode and said elastic element to insulate one from the other, and
    an insulating strip which covers the lateral wall of the case recess below said case cover to insulate from said lateral wall the peripheral edge of chip.

11. A diode assembly according to any one of claims 1, 2, 3, 4, 5, 6, 7, 8, 9 or 10 comprising:
    a plurality of said diode subassemblies interconnected as a rectifier bride for converting an alternating current into a direct or rectified current.

12. A diode assembly according to claim 11, wherein said first electrodes of said diode subassemblies are integrally formed, and individual second electrodes are provided.

* * * * *